(12) United States Patent
Li

(10) Patent No.: US 11,991,839 B2
(45) Date of Patent: May 21, 2024

(54) BEZEL CONNECTION STRUCTURE AND DISPLAY

(71) Applicants: GUANGZHOU SHIYUAN ELECTRONIC TECHNOLOGY COMPANY LIMITED, Guangzhou (CN); GUANGZHOU SHIRUI ELECTRONICS CO., LTD., Guangzhou (CN)

(72) Inventor: Zhenxing Li, Guangzhou (CN)

(73) Assignees: GUANGZHOU SHIYUAN ELECTRONIC TECHNOLOGY COMPANY LIMITED, Guangzhou (CN); GUANGZHOU SHIRUI ELECTRONICS CO., LTD., Guangzhou (CN)

(*) Notice: Subject to any disclaimer, the term of this patent is extended or adjusted under 35 U.S.C. 154(b) by 343 days.

(21) Appl. No.: 17/562,868

(22) Filed: Dec. 27, 2021

(65) Prior Publication Data
US 2022/0124914 A1    Apr. 21, 2022

Related U.S. Application Data

(63) Continuation of application No. PCT/CN2020/098594, filed on Jun. 28, 2019.

(30) Foreign Application Priority Data

Jun. 27, 2019   (CN) .......................... 201920991454.8

(51) Int. Cl.
*H05K 5/00*   (2006.01)
(52) U.S. Cl.
CPC ................................. *H05K 5/0017* (2013.01)

(58) Field of Classification Search
CPC ........................................................ H05K 5/00
See application file for complete search history.

(56) References Cited

U.S. PATENT DOCUMENTS

| 2008/0151479 | A1* | 6/2008 | Tsai | .................. | G02F 1/133308 |
| | | | | | 361/600 |
| 2011/0209431 | A1 | 9/2011 | Tsai | | |
| 2013/0256245 | A1* | 10/2013 | Kuo | ..................... | G06F 1/1601 |
| | | | | | 211/26 |

FOREIGN PATENT DOCUMENTS

| CN | 201265940 Y | 7/2009 |
| CN | 102778766 A | 11/2012 |

(Continued)

OTHER PUBLICATIONS

Indian Examination Report issued in corresponding Indian Patent Application No. 202217000292, dated Mar. 9, 2023, 6 pages.

(Continued)

*Primary Examiner* — Jerry Wu
(74) *Attorney, Agent, or Firm* — BAYES PLLC

(57) ABSTRACT

A bezel connection structure and a display. The bezel connection structure comprises a first bezel (10) and a second bezel (30). A first connection portion (20) is provided on the first bezel (10). A second connection portion (40) is provided on the second bezel (30), and the first connection portion (20) is in lap joint with the second connection portion (40). The first bezel (10) abuts against one end of the second connection portion (40). The cooperation of the bezel connection structure is simple, and production and manufacturing are easy, thereby improving a production efficiency of products, and further reducing the production and manufacturing cost of products.

2 Claims, 5 Drawing Sheets

(56) References Cited

FOREIGN PATENT DOCUMENTS

| | | |
|---|---|---|
| CN | 203182405 U | 9/2013 |
| CN | 203776451 U | 8/2014 |
| CN | 207252108 U | 4/2018 |
| CN | 109117029 A | 1/2019 |
| CN | 208367662 U | 1/2019 |
| CN | 210244877 U | 4/2020 |
| JP | 07102685 A | 4/1995 |
| JP | 2000314872 A | 11/2000 |
| JP | 2001067012 A | 3/2001 |
| JP | 2005196210 A | 7/2005 |
| JP | 2007086625 A | 4/2007 |
| JP | 2007171868 A | 7/2007 |
| JP | 2016066950 A | 4/2016 |

OTHER PUBLICATIONS

Notice of Reasons for Rejection issued in corresponding Japanese Patent Application No. 2021575907, dated Oct. 18, 2022, 7 pages.
Decision to Refuse issued in corresponding Japanese Patent Application No. 2021575907, dated May 16, 2023, 4 pages.
International Search Report issued in corresponding international application No. PCT/CN2020/098594, dated Sep. 27, 2020, 5 pages.
Written Opinion of International Searching Authority in corresponding international application No. PCT/CN2020/098594, dated Sep. 27, 2020, 4 pages.
First Notice of Amendment issued in corresponding CN Patent Application No. 201920991454.8, dated Dec. 12, 2019, 1 page.

\* cited by examiner

BEZEL CONNECTION STRUCTURE AND DISPLAY

CROSS-REFERENCE TO RELATED APPLICATION

The present application is a continuation of International Application No. PCT/CN2020/098594, filed on Jun. 28, 2020, which claims the benefit of priority to Chinese Patent Application No. 201920991454.8, filed on Jun. 27, 2019, both of which are incorporated herein by reference in their entireties.

TECHNICAL FIELD

The present disclosure relates to the display field, and in particular, to a bezel connection structure and a display including the bezel connection structure.

BACKGROUND

With the development of technology, the market demand for displays and TVs is increasing, and the market for bezels of displays and TV used therewith has also expanded. As shown in FIG. 5, a bezel in the prior art includes a first frame 50, a second frame 60 and a connection piece 70. Two ends of the connection piece are respectively inserted into the first frame 50 and the second frame 60, and are fixedly connected to the first frame 50 and the second frame 60 through a plurality of screws. This kind of splicing method is more complicated and have low assembly efficiency. The connection is fixed by screws, causing appearance gap uneasy to control.

SUMMARY

Embodiments of the present disclosure provide a bezel connection structure and a display. The bezel connection structure has a simple integral structure, is simple to be processed, easy to be assembled, and has high reliability.

An embodiment according to a first aspect of the present disclosure provides a bezel connection structure, which comprises a first bezel, on which a first connection portion is provided, and a second bezel, on which a second connection portion is provided. The first connection portion is in lap joint with the second connection portion, and the first bezel abuts against one end of the second connection portion.

In the connection structure provided by the present disclosure, the first bezel and the second bezel are fixedly connected through the cooperation of the first connection portion and the second connection portion. The cooperation structure of the first connection portion and the second connection portion is simple. On the one hand, production and manufacturing are easy, thereby improving a production efficiency of products, and further reducing the production and manufacturing cost of products. On the other hand, assembly is convenient for an operator, that is, an assembly efficiency of products is improved, thereby improving a production efficiency of products, and further reducing the production and manufacturing cost of products. In addition, the first connection portion is in lap joint with the second connection portion, and the first connection portion and the second connection portion partially overlap, thereby ensuring the connection area between the first connection portion and the second connection portion, improving the connection strength of products, and further extending the service life of products.

Optionally, the second connection portion includes a supporting portion and two limiting plates. The supporting portion is in lap joint with the first connection portion, the first bezel abuts against a first end of the supporting portion, and the two limiting plates are symmetrically arranged on both sides of the supporting portion for limiting the movement of the first connection portion in a first direction.

Optionally, a limiting portion is provided on one end of the first connection portion, the limiting portion is clamped on a second end of the supporting portion for limiting the movement of the first connection portion in a second direction.

Optionally, a mounting groove is provided on the second connection portion, and the first connection portion is fixed in the mounting groove.

Optionally, a first positioning portion is provided on one end of the first connection portion, and a second positioning portion that cooperates with the first positioning portion is provided on the second bezel.

Optionally, the first positioning portion is a limiting protrusion, the second positioning portion is a limiting groove, and the limiting protrusion is inserted into the limiting groove.

Optionally, the first positioning portion is a first inserting piece, the second positioning portion is a second inserting piece, and the first inserting piece is plugged into the second inserting piece.

Optionally, the first connection portion is provided with a plurality of convex portions, and the second connection portion is provided with a plurality of concave portions that cooperate with the convex portions.

Optionally, the second connection portion is provided with a threaded hole, the first connection portion is provided with a connection hole, the connection hole is arranged corresponding to the threaded hole, and the first connection portion and the second connection portion are fixedly connected through a screw.

An embodiment according to a second aspect of the present disclosure provides a display, comprising any one of the bezel connection structures described above.

The display provided by the present disclosure has high bezel connection reliability and a long service life, thereby improving the market competitiveness of products.

It is to be understood that both the above general description and the following detailed description are only exemplary and explanatory, which cannot limit the present disclosure.

BRIEF DESCRIPTION OF DRAWINGS

In order to more clearly describe the technical embodiments in the embodiments of the present disclosure, these embodiments or the drawings that need to be used in the description of the prior art will be briefly described hereinafter.

Figure 1:
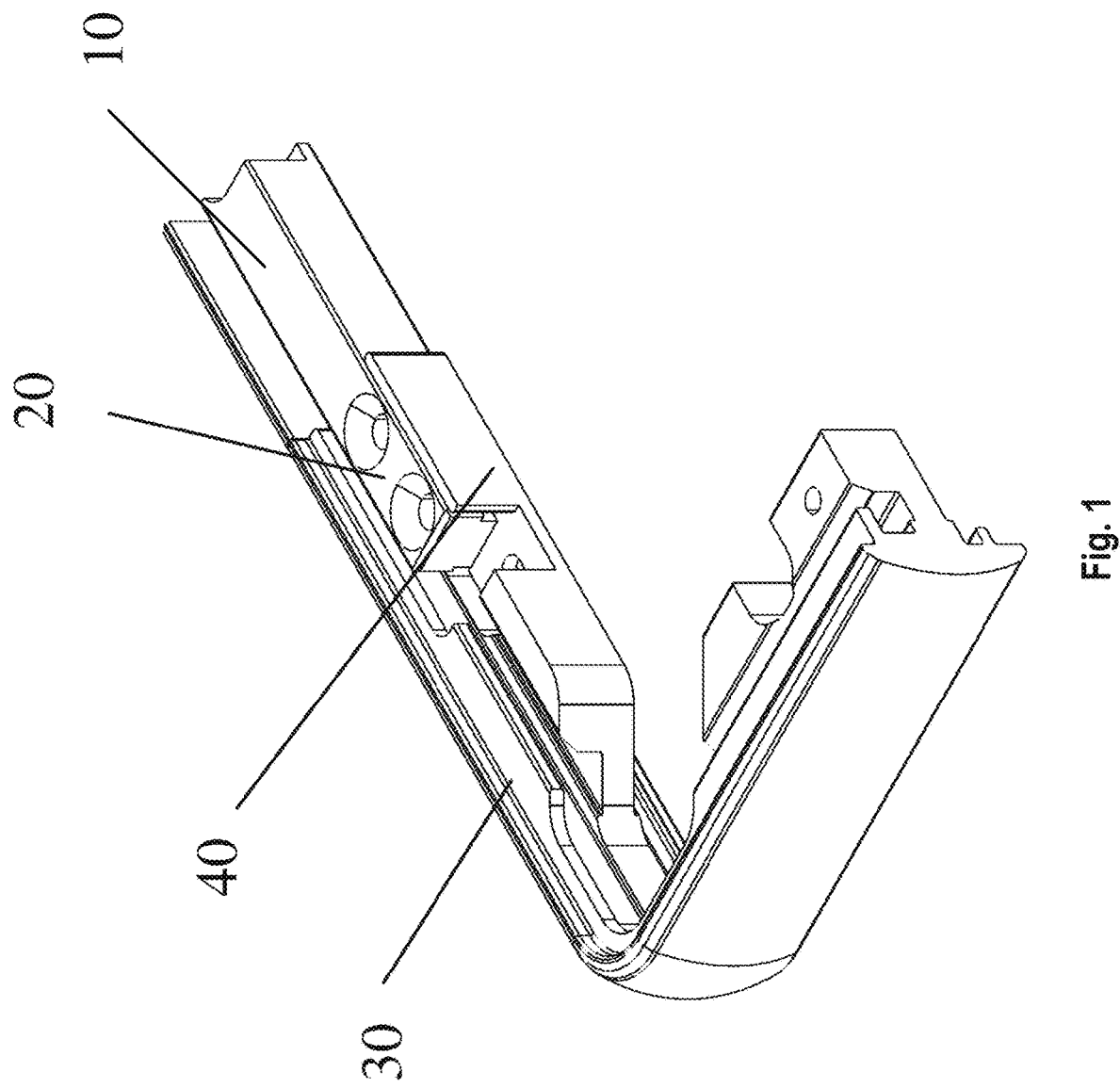
FIG. 1 is a three-dimensional structure diagram of the bezel connection structure according to an embodiment of the present disclosure.

In the drawings, a corresponding relationship between reference numbers and component names in FIGS. 1 to 5 is—first bezel 10, first connection portion 20, limiting portion 21, connection hole 22, second bezel 30, second connection portion 40, supporting portion 41, limiting plate 42, threaded hole 43, first frame 50, second frame 60, connection piece 70.

DETAILED DESCRIPTION

The following discussion provides several embodiments of the present disclosure. Although each embodiment represents a single combination of elements of the utility model, the elements of different embodiments of the present disclosure can be replaced or combined. Therefore, the present disclosure may also be considered to include all possible combinations of elements in the same and/or different embodiments described. Therefore, if one embodiment includes elements A, B, and C, and another embodiment includes a combination of elements B and D, the present disclosure is also deemed to include embodiments of all other possible combinations including one or more elements of A, B, C, and D, which although may not be clearly described in the following contents.

Figure 2:
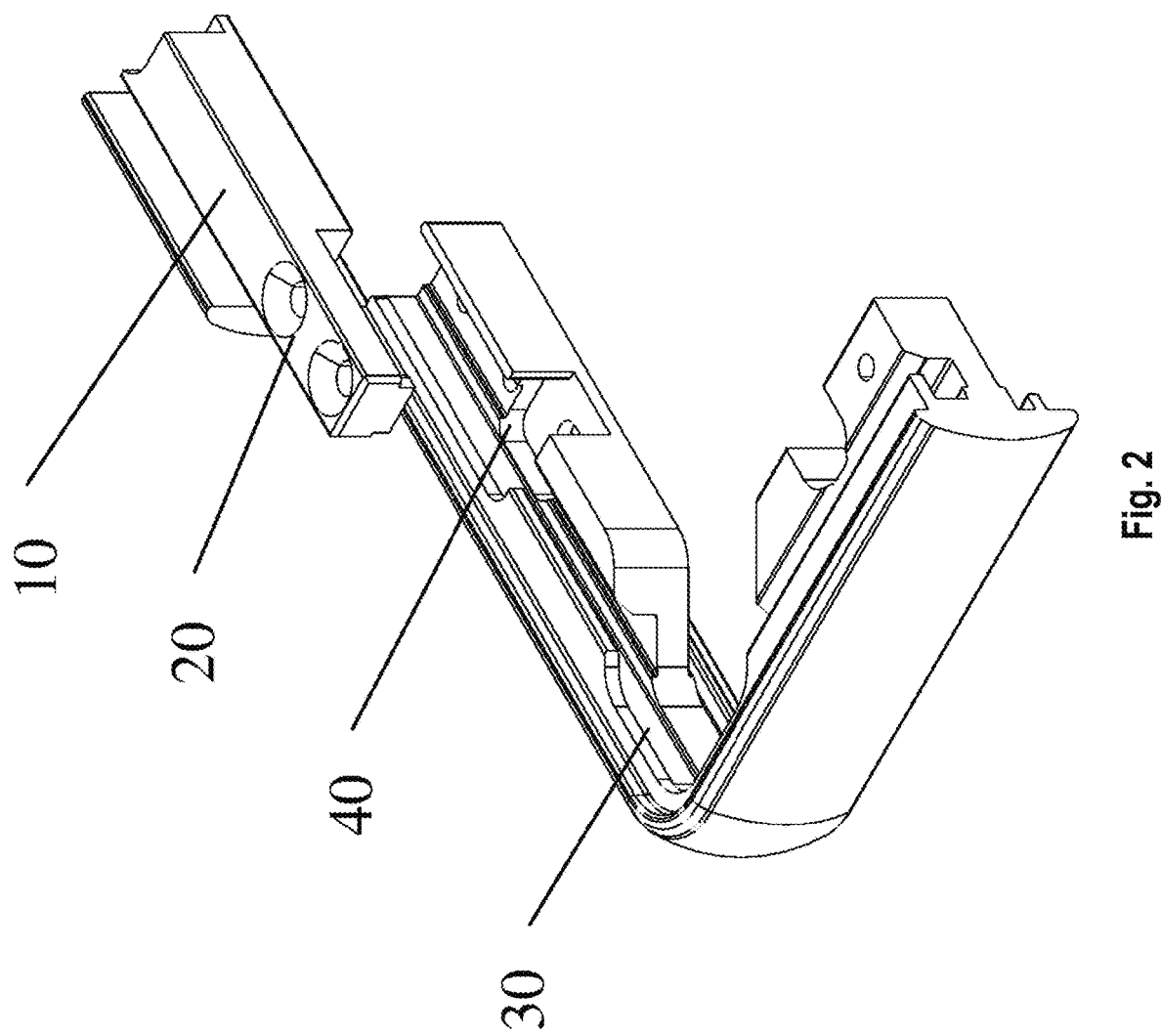
FIG. 2 is a schematic diagram of an exploded structure of the bezel connection structure shown in FIG. 1.

As shown in FIGS. 1 and 2, the bezel connection structure provided by an embodiment according to the first aspect of the present disclosure includes a first bezel 10 and a second bezel 30.

Specifically, a first connection portion 20 is provided on the first bezel 10. A second connection portion 40 is provided on the second bezel 30, and the first connection portion 20 is in lap joint with the second connection portion 40. The first bezel 10 abuts against one end of the second connection portion 40.

In the connection structure provided by the present disclosure, the first bezel 10 and the second bezel 30 are fixedly connected through the cooperation of the first connection portion 20 and the second connection portion 40. The cooperation structure of the first connection portion 20 and the second connection portion 40 is simple. On the one hand, production and manufacturing are easy, thereby improving a production efficiency of products, and further reducing the production and manufacturing cost of products. On the other hand, assembly is convenient for an operator, that is, an assembly efficiency of products is improved, thereby improving a production efficiency of products, and further reducing the production and manufacturing cost of products. In addition, the first connection portion 20 is in lap joint with the second connection portion 40, and the first connection portion 20 and the second connection portion 40 partially overlap, which ensure the connection area between the first connection portion 20 and the second connection portion 40, thereby improving the connection strength of products, and further extending the service life of products.

Figure 3:
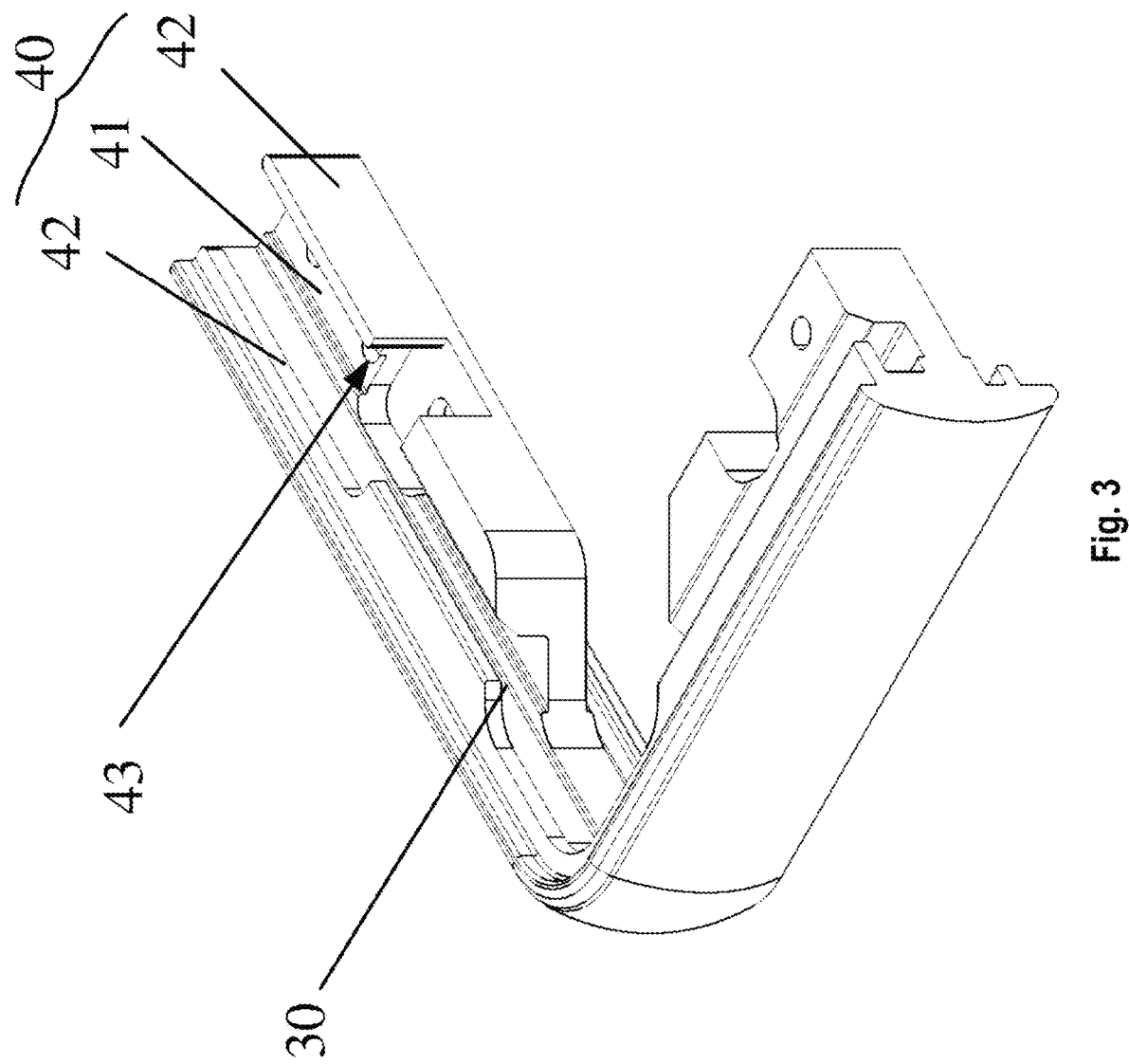
FIG. 3 is a schematic diagram of a three-dimensional structure of the second bezel according to an embodiment of the present disclosure.

As shown in FIG. 3, in an embodiment of the present disclosure, the second connection portion 40 includes a supporting portion 41 and two limiting plates 42.

The supporting portion 41 is in lap joint with the first connection portion 20, and the first bezel 10 abuts against a first end of the supporting portion 41. The two limiting plates 42 are symmetrically arranged on both sides of the supporting portion 41 for limiting the movement of the first connection portion 20 in a first direction.

In this embodiment, the limiting plates 42 play a role in positioning, so as to prevent deviation of the first connection portion 20 during the installation process, which causes inaccurate positioning between the second connection portion 40 and the first connection portion 20, thereby ensuring an installation accuracy of products, and further improving yield of products.

Figure 4:
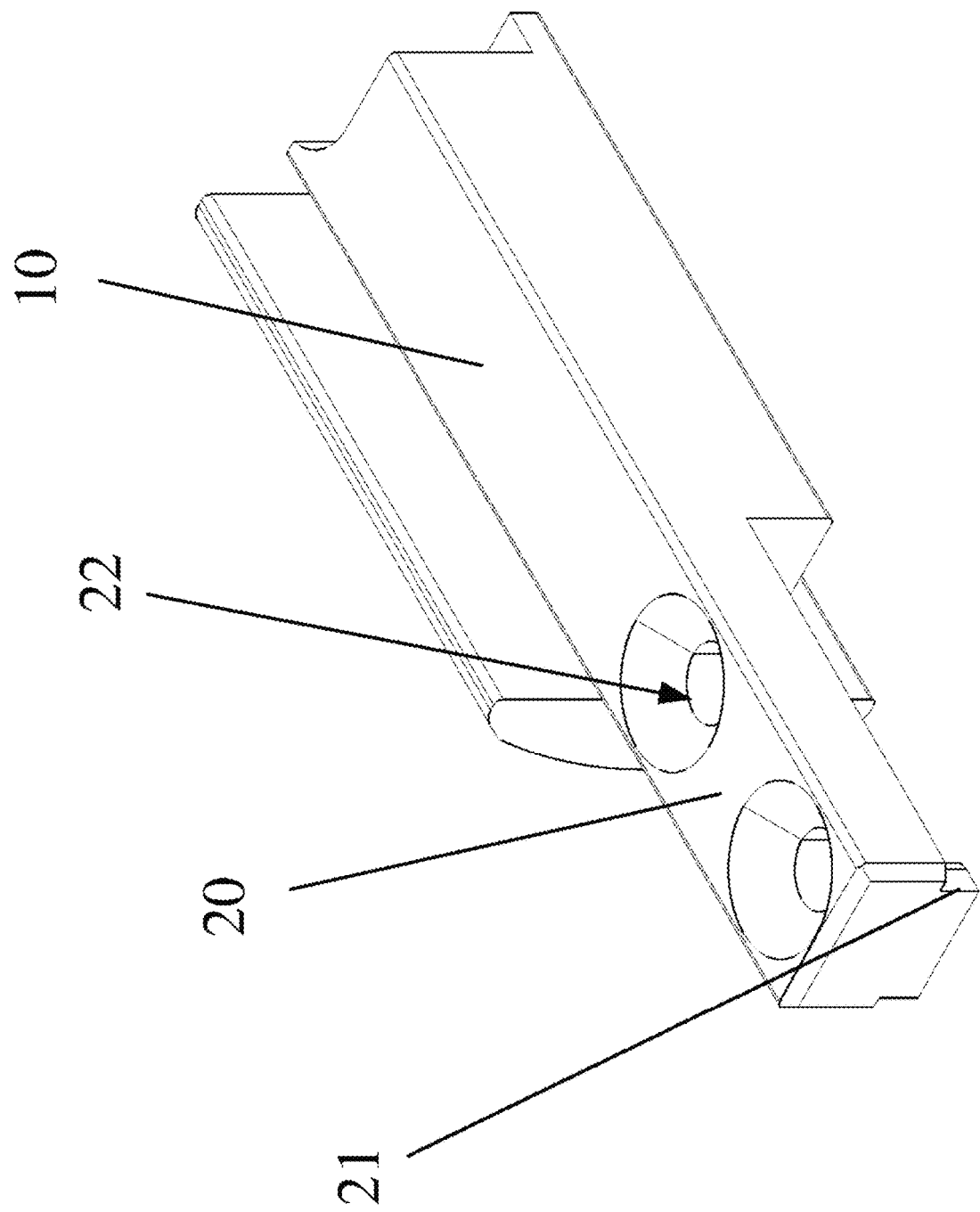
FIG. 4 is a schematic diagram of a three-dimensional structure of the first bezel according to an embodiment of the present disclosure.
Figure 5:
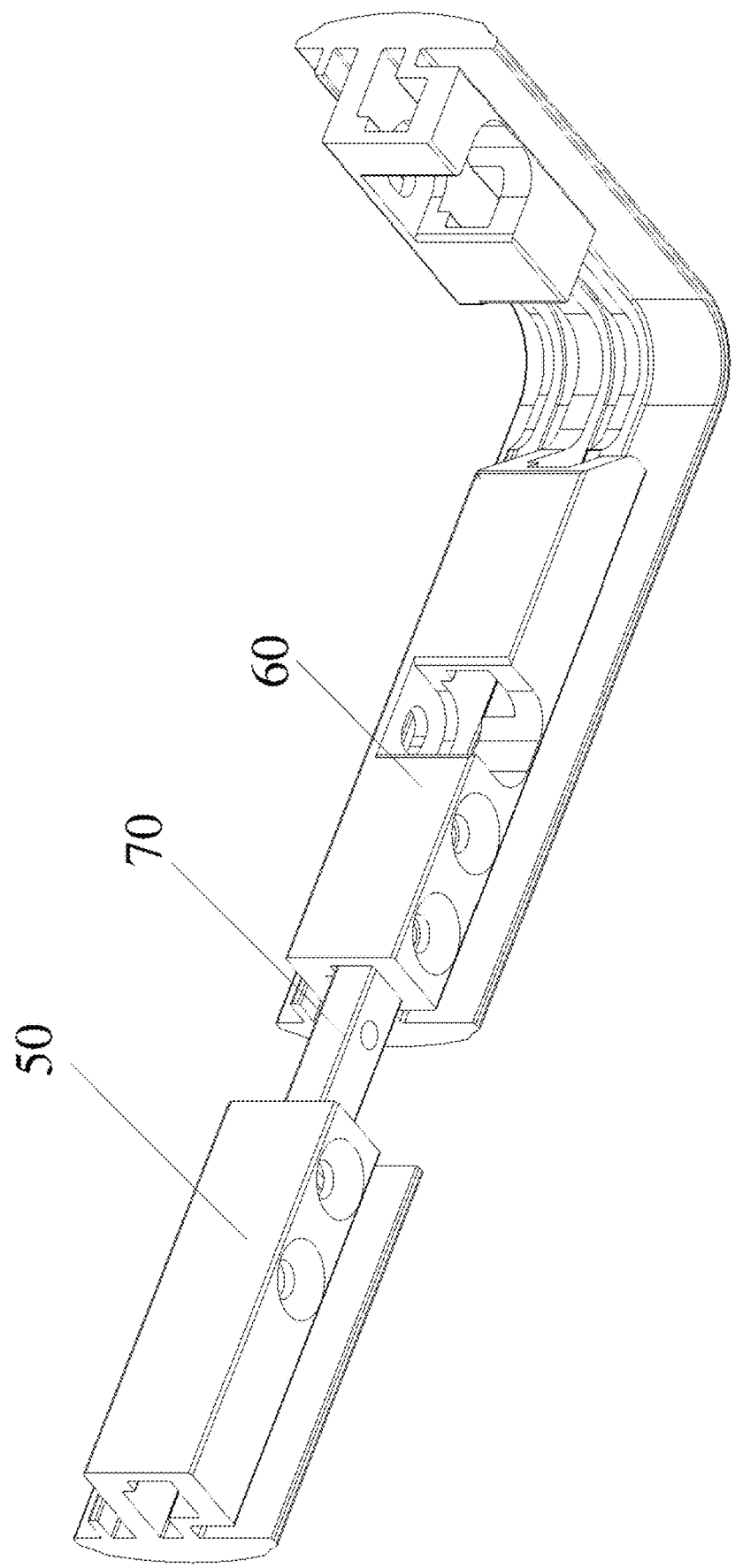
FIG. 5 is a schematic diagram of an exploded structure of the bezel connection structure in the prior art.

As shown in FIG. 4, in an embodiment of the present disclosure, a limiting portion 21 is provided on one end of the first connection portion 20, and the limiting portion 21 is clamped on a second end of the supporting portion 41 for limiting the movement of the first connection portion 20 in a second direction. The first end and the second end of the supporting portion are provided as opposite ends of the supporting portion.

In this embodiment, the cooperation of the limiting portion 21 and the limiting plates 42 can achieve accurate positioning of products. On the one hand, the installation accuracy of products is ensured, thereby improving yield of products. On the other hand, the assembly efficiency of products is improved, thereby reducing the production and manufacturing cost of products.

In an embodiment of the present disclosure, a mounting groove is provided on the second connection portion, and the first connection portion is fixed in the mounting groove.

In this embodiment, the mounting groove plays a role in positioning, which can quickly install the first connection portion and the second connection portion together, thereby improving the assembly efficiency of products, and further reducing the production and manufacturing cost of products.

In an embodiment of the present disclosure, a first positioning portion is provided on one end of the first connection portion, and the second bezel is provided with a second positioning portion that cooperates with the first positioning portion.

In this embodiment, the cooperation of the first positioning portion and the second positioning portion can achieve accurate positioning of products, thereby ensuring the installation accuracy of products, and further improving yield of products. In addition, the cooperation of the first positioning portion and the second positioning portion can achieve rapid positioning of products, thereby improving the assembly efficiency of products, and further reducing the production and manufacturing cost of products.

In an embodiment of the present disclosure, the first positioning portion is a limiting protrusion, the second positioning portion is a limiting groove, and the limiting protrusion is inserted into the limiting groove.

In this embodiment, the cooperation structure of the limiting protrusion and the limiting groove is simple. On the one hand, production and manufacturing are easy, thereby improving the production efficiency of products, and further reducing the production and manufacturing cost of products. On the other hand, assembly is convenient for an operator, that is, the assembly efficiency of products is improved, thereby improving the production efficiency of products, and further reducing the production and manufacturing cost of products.

In an embodiment of the present disclosure, the first positioning portion is a first inserting piece, the second positioning portion is a second inserting piece, and the first inserting piece is plugged into the second inserting piece.

In this embodiment, the cooperation structure of the first inserting piece and the second inserting piece is simple, which can achieve rapid positioning of products, thereby improving the assembly efficiency of products, and further reducing the production and manufacturing cost of products.

In an embodiment of the present disclosure, the first connection portion is provided with a plurality of convex portions, and the second connection portion is provided with a plurality of concave portions that cooperate with the convex portions.

In this embodiment, the plurality of convex portions provided on the first connection portion cooperate with the concave portions on the second connection portion cooperate, which can achieve rapid positioning of products, thereby improving the assembly efficiency of products, and further reducing the production and manufacturing cost of products.

In an embodiment of the present disclosure, as shown in FIG. 3, the second connection portion 40 is provided with a threaded hole 43, and as shown in FIG. 4, the first connection portion 20 is provided with a connection hole 22. The connection hole 22 is arranged corresponding to the threaded hole 43, and the first connection portion 20 and the second connection portion 40 are fixedly connected through a screw.

In this embodiment, the screw fixing-connection method has a simple structure, low price, and convenient assembly and disassembly, which improves the assembly efficiency of products, thereby improving the production efficiency of products, and further reducing the production and manufacturing cost of products. In addition, the connection is reliable and strong by the screw fixing-connection method, thereby ensuring a prolonged service life of products.

A display provided by an embodiment according to the second aspect of the present disclosure includes any one of the bezel connection structures described above.

The display provided by the present disclosure has high bezel connection reliability and a long service life, thereby improving a market competitiveness of products.

In the present disclosure, the terms "first" and "second" are only used for descriptive purposes, and cannot be understood as indicating or implying relative importance. The terms "install," "connect with," "connect," "fix" and other terms should be understood in a broad sense. For example, "connect" can be a fixed connection, a detachable connection, or an integral connection. "Connect" can be direct connection or indirect connection through an intermediary. For those skilled in the art, the specific meanings of the above-mentioned terms in the present disclosure can be understood according to specific circumstances.

The foregoing descriptions are only preferred embodiments of the present disclosure, and are not intended to limit the present disclosure. For those skilled in the art, the present disclosure can have various modifications and changes. Any modification, equivalent replacement, improvement, etc. made within the spirit and principle of the present disclosure shall be included in the scope of the present disclosure.

What is claimed is:

1. A bezel connection structure, comprising:
   a first bezel, on which a first connection portion is provided; and
   a second bezel, on which a second connection portion is provided,
   wherein the first connection portion is in lap joint with the second connection portion, and the first bezel abuts against one end of the second connection portion, wherein
   the second connection portion comprises:
   a supporting portion and a limiting groove extended from a first end to a second end of the supporting portion, wherein the supporting portion is in lap joint with the first connection portion when a limiting protrusion of the first connection portion is inserted into the limiting groove along a first direction, and the first bezel abuts against the first end of the supporting portion; and
   two limiting plates, wherein the two limiting plates are symmetrically arranged on both sides of the supporting portion for limiting the movement of the first connection portion in a second direction perpendicular to the first direction, and wherein
   a limiting portion is provided on a first end of the first connection portion away from the first bezel, and the limiting portion is clamped on the second end of the supporting portion for limiting the movement of the first connection portion in a third direction perpendicular to the first and second directions, and
   the second connection portion is provided with a threaded hole, the first connection portion is provided with a connection hole, the connection hole is arranged corresponding to the threaded hole, and the first connection portion and the second connection portion are fixedly connected through a screw.

2. The bezel connection structure according to claim 1, wherein the first connection portion is provided with a plurality of convex portions, and the second connection portion is provided with a plurality of concave portions that cooperate with the plurality of convex portions.

* * * * *